(12) United States Patent
Tan et al.

(10) Patent No.: US 8,411,537 B2
(45) Date of Patent: *Apr. 2, 2013

(54) SYSTEMS AND METHODS FOR RECOVERING INFORMATION FROM A DEFECTIVE MEDIUM

(75) Inventors: Weijun Tan, Longmont, CO (US); Kelly Fitzpatrick, Sudbury, MA (US); Shaohua Yang, Santa Clara, CA (US)

(73) Assignee: Agere Systems Inc., Allentown, PA (US)

( * ) Notice: Subject to any disclaimer, the term of this patent is extended or adjusted under 35 U.S.C. 154(b) by 462 days.

This patent is subject to a terminal disclaimer.

(21) Appl. No.: 12/399,750

(22) Filed: Mar. 6, 2009

(65) Prior Publication Data

US 2010/0229031 A1    Sep. 9, 2010

(51) Int. Cl.
*G06F 11/20* (2006.01)

(52) U.S. Cl. ............... 369/47.14; 369/44.32; 369/44.33; 369/53.15; 369/53.17; 714/6.1

(58) Field of Classification Search ............... 369/47.14, 369/44.32, 44.33, 53.15, 53.17
See application file for complete search history.

(56) References Cited

U.S. PATENT DOCUMENTS

| | | | |
|---|---|---|---|
| 6,065,149 A | 5/2000 | Yamanaka | |
| 6,691,263 B2 | 2/2004 | Vasic et al. | |
| 6,738,948 B2 | 5/2004 | Dinc et al. | |
| 6,980,382 B2 | 12/2005 | Hirano et al. | |
| 7,154,936 B2 | 12/2006 | Bjerke et al. | |
| 7,168,030 B2 | 1/2007 | Aryoshi | |
| 7,203,015 B2 | 4/2007 | Sakai et al. | |
| 7,237,173 B2 | 6/2007 | Morita et al. | |
| 7,254,192 B2 | 8/2007 | Onggosanusi | |
| 7,257,172 B2 | 8/2007 | Okamoto et al. | |
| 7,359,313 B2 | 4/2008 | Chan et al. | |
| 7,441,174 B2 | 10/2008 | Li et al. | |
| 7,688,915 B2 | 3/2010 | Tanrikulu et al. | |
| 8,149,527 B2* | 4/2012 | Tan et al. | 360/25 |
| 2003/0063405 A1 | 4/2003 | Jin et al. | |
| 2006/0044978 A1* | 3/2006 | Oh | 369/53.17 |

(Continued)

FOREIGN PATENT DOCUMENTS

| | | |
|---|---|---|
| JP | 10-145243 | 5/1998 |
| JP | 2007-087529 | 4/2007 |

OTHER PUBLICATIONS

U.S. Appl. No. 12/399,679, filed Mar. 6, 2009, Dziak, Scott.

(Continued)

*Primary Examiner* — Joseph Feild
*Assistant Examiner* — Linh N Hoffner
(74) *Attorney, Agent, or Firm* — Hamilton DeSanctis & Cha (57) ABSTRACT

Various embodiments of the present invention provide systems and methods for data regeneration. For example, a system for regenerating data is disclosed. The system includes a media defect detector that is operable to identify a potential media defect associated with a medium from which an input signal is derived, an attenuation amplitude detector that generates an attenuation factor, and a data detector. The data detector includes a first data path and a second data path. The first data path includes a bank of two or more selectable noise prediction filters and the second data path includes a fixed noise prediction filter and the attenuation factor. The data detector processes a derivative of the input signal using the second data path when the potential media defect is indicated, and processes the derivative of the input signal using the first data path when a media defect is not indicated.

40 Claims, 6 Drawing Sheets

U.S. PATENT DOCUMENTS

| | | | |
|---|---|---|---|
| 2006/0187800 A1* | 8/2006 | Ogura | 369/124.04 |
| 2007/0061687 A1 | 3/2007 | Hwang | |
| 2007/0242580 A1* | 10/2007 | Kikugawa et al. | 369/53.12 |
| 2009/0235116 A1 | 9/2009 | Tan et al. | |
| 2009/0235146 A1 | 9/2009 | Tan et al. | |
| 2009/0268575 A1 | 10/2009 | Tan et al. | |
| 2009/0268848 A1 | 10/2009 | Tan et al. | |
| 2009/0271670 A1 | 10/2009 | Tan et al. | |
| 2010/0042877 A1 | 2/2010 | Tan | |
| 2010/0074078 A1* | 3/2010 | Cao et al. | 369/53.17 |

OTHER PUBLICATIONS

U.S. Appl. No. 12/399,713, filed Mar. 6, 2009, Weijun, Tan.

Kavcic, Aleksander et al., A Signal-Dependent Autoagressive Channel Model, IEEE Transactions on Magnetics, vol. 35, No. 5, Sep. 1999, pp. 2316-2318.

* cited by examiner

SYSTEMS AND METHODS FOR RECOVERING INFORMATION FROM A DEFECTIVE MEDIUM

BACKGROUND OF THE INVENTION

The present inventions are related to systems and methods for transferring information, and more particularly to systems and methods for obtaining data from a defective medium associated with a data transfer.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any defects associated with the transfer medium. In some cases, data loss caused by defects in the transfer medium (e.g., a physical defect or noise associated therewith) can make recovery of data from the transfer medium difficult even for data received from non-defective areas or times. In some cases, detecting a media defect allows for recovering data from the defective area by allowing downstream digital processing to correct any errors. Often, however, the defective region is too large or the defect too prevalent for downstream processing to provide the desired error correction.

Hence, for at least the aforementioned reasons, there exists a need in the art for advanced systems and methods for obtaining data from potentially defective media.

BRIEF SUMMARY OF THE INVENTION

The present inventions are related to systems and methods for transferring information, and more particularly to systems and methods for obtaining data from a defective medium associated with a data transfer.

Various embodiments of the present invention provide methods for regenerating data derived from a defective medium. Such methods include providing a data regeneration circuit that includes a first data path with a bank of two or more data dependent, selectable noise prediction filters and a second data path with a data dependent, fixed noise prediction filter. The methods further include receiving a data input that is derived from a medium, identifying a media defect corresponding to the data input, and based at least in part on the identified media defect, asserting a media defect flag. The second data path is selected for processing whenever the media defect flag is asserted. In some instances of the aforementioned embodiments, the methods further include determining an attenuation factor associated with the defective medium. The attenuation factor is incorporated in the second data path. Augmenting the data input by a derivative of the attenuation factor to regenerate the data.

In particular instances of the aforementioned embodiments, the data input is represented as y, the attenuation factor is represented as $\eta$, the fixed noise prediction filter is represented as $f(0000)$, and an ideal filter is represented as $\text{IDEAL}'(X_3X_2X_1X_0)$. In this case, $X_3$ is the least recent input and $X_0$ is the most recent input. The second data path yields an output represented as: $[f(0000)*y - \eta \cdot \text{IDEAL}'(X_3X_2X_1X_0)]^2/N0$. For the purposes of this document, the notation $f(x)*y$ indicates a convolution of $f(x)$ by y. The notation $\text{IDEAL}'(X_3X_2X_1X_0)$ is equivalent to $f(0000)*$noise y on branch $(X_3X_2X_1X_0)$, where the notation * indicates a convolution. The notation · indicates a multiplication function in contrast to * that indicates a convolution or filtering function. In some instances of the aforementioned embodiments, the method further includes receiving a second data input that is derived from the medium, and determining that the medium is non-defective at the location corresponding to the second data input. The first data path is selected for processing whenever the media defect flag is de-asserted.

In particular instances of the aforementioned embodiments, the data input is represented as y, the attenuation factor is represented as a, the fixed noise prediction filter is represented as $f(000)$, and an ideal filter is represented as $\text{IDEAL}'(X_2X_1X_0)$. In this case, $X_2$ is the least recent input and $X_0$ is the most recent input. The second data path yields an output represented as: $[f(000)*y - \eta \cdot \text{IDEAL}'(X_2X_1X_0)]^2/N0$. For the purposes of this document, the notation $f(x)*y$ indicates a convolution of $f(x)$ by y. The notation $\text{IDEAL}'(X_2X_1X_0)$ is equivalent to $f(000)*$noise y on branch $(X_2X_1X_0)$, where the notation * indicates a convolution.

It should be noted that the values of the inputs may be generalized to any number of time instants represented as Zn. In the case of a four input system, Zn is represented as $(\overline{Zn}, Zn_{-1}, Zn_{-2}, Zn_{-3})$. $\overline{Zn}$ is the least recent input (similar to $X_3$ from the four input example above) and $Zn_{-3}$ is most recent input (similar to $X_0$ from the four input example above). In the case of a three input system, Zn is represented as $(Zn, Zn_{-1}, Zn_{-2})$. $\overline{Zn}$ is the least recent input (similar to $X_2$ from three input example above) and $Zn_{-2}$ is most recent input (similar to $X_0$ from the three input example above). Based on the disclosure provided herein, one of ordinary skill in the art will recognize other numbers of inputs that may be used in relation to different embodiments of the present invention.

In various instances of the aforementioned embodiments, the first data path includes a multiplier augmenting the processed data by a programmable scalar value. In one or more instances of the aforementioned embodiment, an output of the second data path is multiplied by a programmable scalar value.

Other embodiments of the present invention provide systems for regenerating data. Such systems include a media defect detector that is operable to identify a potential media defect associated with a medium from which an input signal is derived, an attenuation amplitude detector that generates an attenuation factor, and a data detector. The data detector includes a first data path and a second data path. The first data path includes a bank of two or more selectable noise prediction filters and the second data path includes a fixed noise prediction filter and the attenuation factor. The data detector processes a derivative of the input signal using the second data path when the potential media defect is indicated, and processes the derivative of the input signal using the first data path when a media defect is not indicated.

In some instances of the aforementioned embodiments, the data detector is a maximum a posteriori detector. As used herein, the phrase "maximum a posteriori detector" is used in its broadest sense to mean any detector that operates similar to maximum a posteriori detectors known in the art. In other instances of the aforementioned embodiments, the data detector is a soft output Viterbi algorithm detector as are known in the art. In various instances of the aforementioned embodiments, an output of the data detector is provided to a decoder that provides a decoded output reflecting a regenerated value of the input signal. In particular cases, the decoder is a low density parity check decoder. In some cases, the data detector processes the input signal without augmentation by the attenuation factor when the potential media defect is not indicated. In various cases, an output of the second data path is multiplied by a programmable scalar value. In one or more cases, the second data path includes a multiplier augmenting the processed data by a programmable scalar value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for obtaining data from a defective medium associated with a data transfer.

Media defect detection is a key operation in a magnetic recording system. If not appropriately handled, data derived from a defective region of a medium can degrade or even disable such a magnetic recording system. Some embodiments of the present invention provide a mechanism for estimating an attenuation (i.e., generating an attenuation factor) associated with a data signal derived from a defective medium. The attenuation factor is used to augment the data signal derived from the defective medium. This process allows for use of a data signal derived from a defective medium, rather than simply nullifying the input data signal. Other approaches for regenerating information from a defective medium are disclosed in U.S. patent application Ser. No. 12/111,889 entitled "Systems and Methods for Reducing Attenuation of Information Derived from a Defective Medium", and filed Apr. 29, 2008 by Tan et al. The entirety of the aforementioned patent application is incorporated herein by reference for all purposes. In embodiments of the present invention, performance can be improved over previous implementations by using a single value noise prediction FIR filter for all hard outputs (nrz) of $X_3X_2X_1X_0$ in place of a bank of noise prediction FIR filters.

Figure 1:
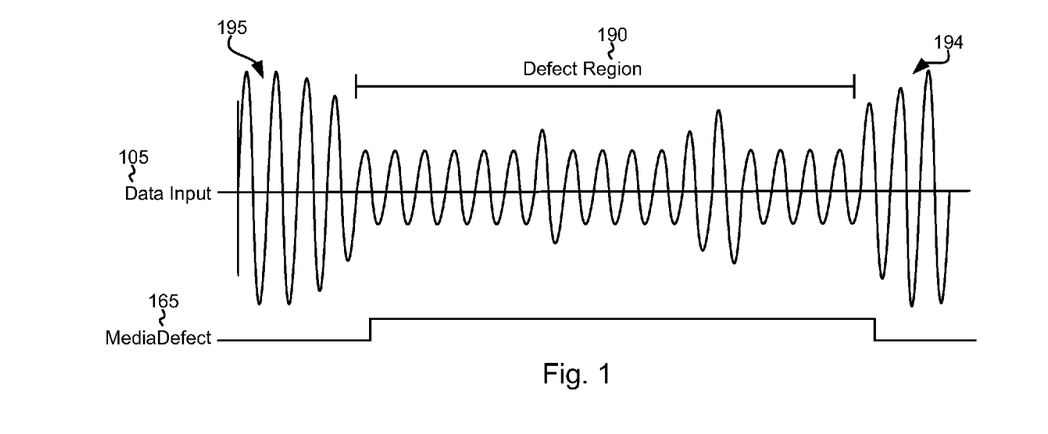
FIG. 1 is a timing diagram depicting an exemplary operation of the data regeneration system in accordance with some embodiments of the present invention.

Turning to FIG. 1, a timing diagram 100 shows an exemplary data input signal 105 is that includes both non-defective regions 192, 194 and an intervening defective region 190. When a media defect flag 165 is asserted high indicating defect region 190. As shown, during defect region 190, data input signal 105 is attenuated when compared with that derived during non-defective regions 192, 194. It should be noted that in some cases, data input signal 105 may exhibit a substantial DC offset during defect region 190. In such cases, data input signal 105 may be high pass filtered to eliminate any DC offset. As described below in greater detail, various embodiments of the present invention multiply data input signal 105 by an attenuation factor in an attempt to derive valid information from defect region 190. Some embodiments of the present invention include one or more programmable scalars that can be tuned in an attempt to recover information from defect region 190. Such tuning may be made based upon whether a downstream data detection and/or data decoding process is converging or not.

Figure 2:
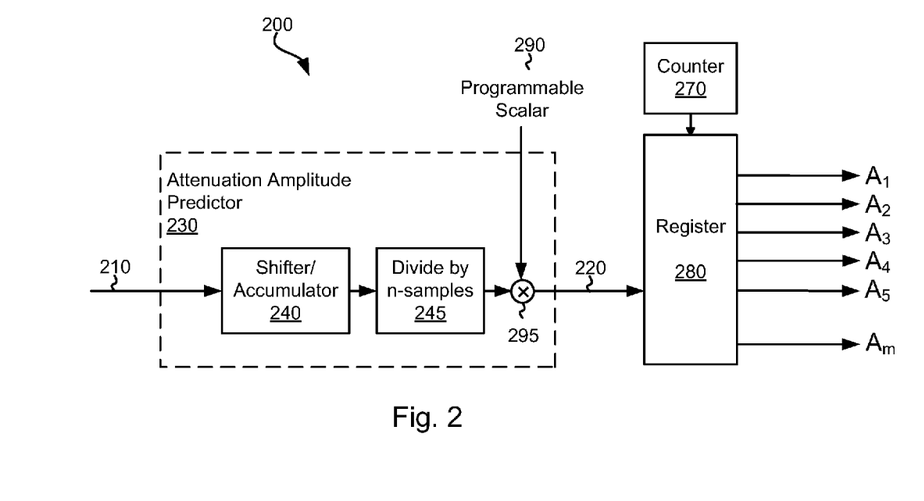
FIG. 2 depicts an attenuation amplitude determination circuit in accordance with various embodiments of the present invention.

Turning to FIG. 2, an attenuation amplitude determination circuit 200 is shown in accordance with various embodiments of the present invention. Attenuation amplitude determination circuit 200 includes an attenuation amplitude predictor circuit 230, a register 280 and a counter 270. In operation, attenuation amplitude predictor circuit 230 provides a number (m) of magnitude outputs (Ai) that are registered over a period as controlled by a counter 270. Attenuation amplitude predictor 230 includes a shifter/accumulator 240 that stores a number of samples (n) of an input 210 which are then summed. A divider circuit 245 receives the sum of n-samples and divides the sum by n to yield an average value 215 of the samples. Average value 215 is multiplied by a programmable scalar value 290 to yield a scaled average 220. In the default state, programmable scalar value 290 is unity. Scaled average 220 is stored to a location in register 280 under the direction of counter 270. A subsequent n-samples of input 210 are processed and stored to another location in register 280 under the direction of counter 270. This process is repeated until a number of magnitude outputs (Ai) are generated covering different sample portions of input 210. In some cases, the samples used to generate one magnitude output ($A_i$) overlap to some degree with the samples used to generate a subsequent magnitude output ($A_{i+1}$). These magnitude outputs are compared with corresponding maximum magnitude outputs (or outputs from known non-defective regions) from other regions of the medium to determine respective corresponding attenuation factors ($\eta_i$). As more fully discussed below, one or more of the determined attenuation factors is applied to data input signal 105 whenever media defect flag 165 is asserted indicating defect region 190.

Figure 3:
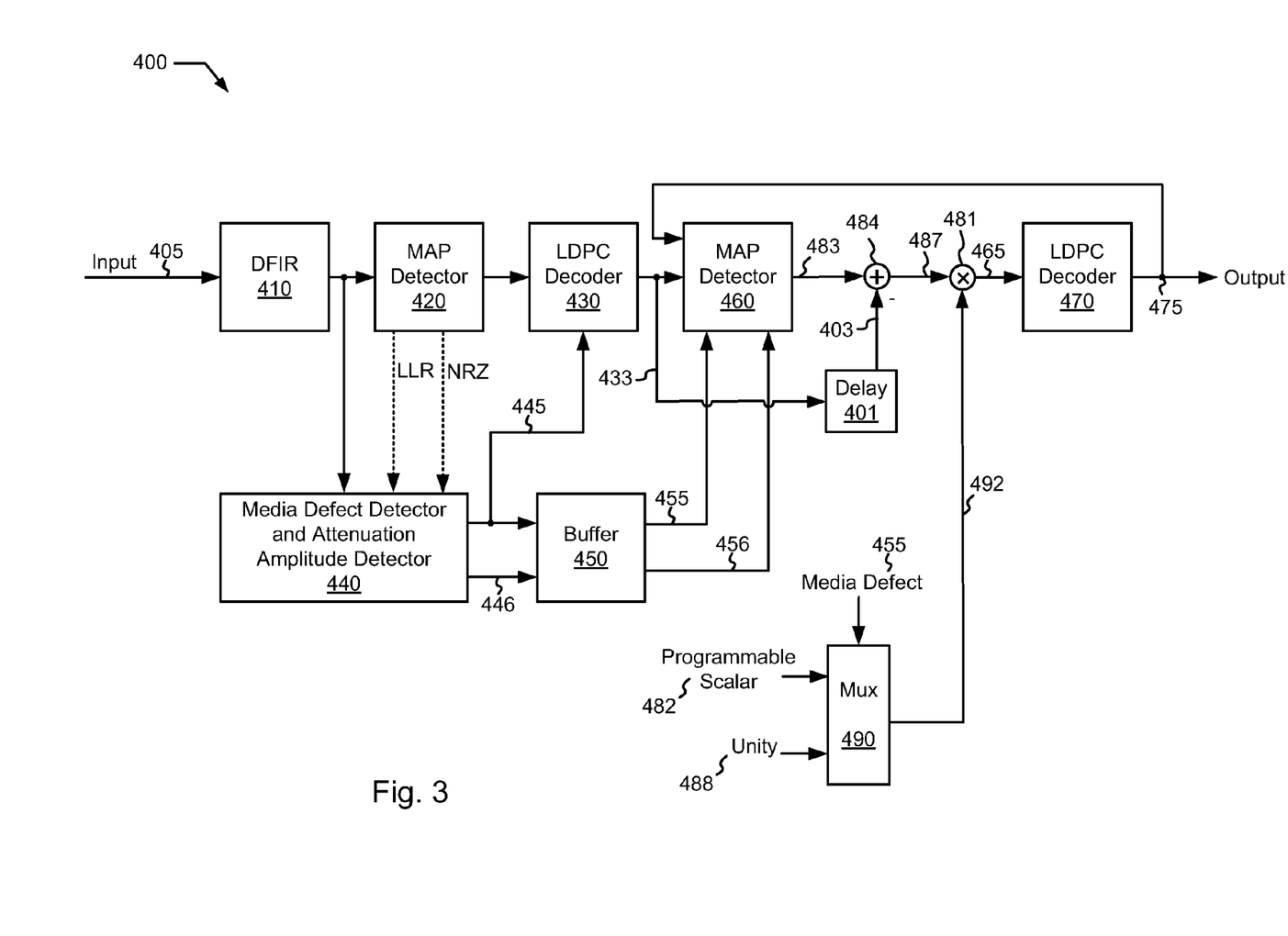
FIG. 3 depicts a data regeneration system in accordance with some embodiments of the present invention.

Turning to FIG. 3, a data regeneration system 400 is depicted in accordance with various embodiments of the present invention. Data regeneration system 400 receives an input 405 that is provided to a digital FIR filter 410. Input 405 may be received via a particular medium (not shown). As an example, input 405 may be derived from a magnetic storage medium, a wireless link, a wired link or the like. Based on the disclosure provided herein one of ordinary skill in the art will recognize a variety of media from which input 405 may be derived. In some cases, input 405 may be amplified and/or converted from one domain to another (e.g., an analog to digital conversion) prior to being received by data regeneration system 400.

The output of digital FIR filter 410 is provided to a combination media defect detector and attenuation amplitude detector 440. In addition, combination media defect detector and attenuation amplitude detector 440 receive or generate soft output information (LLR) and hard output information (nrz) that is based on the output from digital FIR filter 410. Combination media defect detector and attenuation amplitude detector 440 provides both a media defect output 445 and attenuation factors 446. Media defect output 445 is asserted whenever a possible media defect is identified. Combination media defect detector and attenuation amplitude detector 440 may include any media defect detector known in the art that is capable of determining the possibility of a media defect. Exemplary media defect detectors are disclosed in PCT Patent Application No. PCT/US07/80043 entitled "Systems and Methods for Media Defect Detection" and filed on Oct. 1, 2007 by Tan. The entirety of the aforementioned patent application is incorporated herein by reference for all purposes. It should be noted that other types a media defect detectors may be used in relation to the various embodiments of the present invention. In addition, media defect detector and attenuation amplitude detector 440 also includes an attenuation factor determination circuit. Such a circuit may be similar to that described in relation to FIG. 2 above. A buffer 450 receives media defect output 445 and attenuation factors 446 and provides corresponding time delayed media defect flag 455 attenuation factor 456.

The output of digital FIR filter 410 is provided to a MAP detector 420 that operates consistent with MAP detectors as are known in the art. A soft output from MAP detector 420 is provided to an LDPC decoder 430 as are known in the art. In contrast to general use of LDPC decoder 430, the soft input from MAP detector 420 provided as an input to LDPC decoder 430 may be nullified whenever media defect output 445 is asserted indicating that a media defect exists.

An extrinsic LLR output 433 of LDPC decoder 430 is provided to a subsequent MAP detector 460 that operates consistent with MAP detectors as are known in the art. In contrast to general use of LDPC decoder 430, the branch metric of MAP detector 460 is modified through a data regeneration process whenever a media defect flag 455 is asserted indicating that a media defect exists. The following pseudo-code represents the branch metric of MAP detector 460 where the value of η is a selected attenuation factor 456 designed to regenerate data derived from a defective media:

```
IF (Media Defect Flag 455 Indicates no Defect)
{
    Branch Metric = [f(X₃X₂X₁X₀)*y−IDEAL(X₃X₂X₁X₀)]²/N0 + Soft Input
}
ELSE IF (Transitional Period)
{
    Branch Metric = (1+alpha)(Soft Input)
}
ELSE (Media Defect Flag 655 Indicates a Defect)
{
    Branch Metric = [f(0000)*y−η·IDEAL'(X₃X₂X₁X₀)]²/N0 + Soft Input
}
```

Generation of the above mentioned branch metric values are described in greater detail below in relation to FIGS. 4a-4b. The notation · indicates a multiplication function in contrast to * that indicates a convolution or filtering function.

The transitional period is a time between a defective and non-defective region that may be considered too volatile to use for regenerating a data signal in accordance with the approaches discussed herein. In such cases, it may be that data regeneration is only performed in the middle of the window during which a media defect flag is asserted, and that during the transitional period the branch metric is set equal to (1+alpha)(Soft Input). This avoids data regeneration during the transition from a non-defective region to a defective region, and from a defective region to a non-defective region. Once the initial transitional period from non-defective region to defective region has passed, the process may convert to utilizing regenerated data. This process of using regenerated data could give way to a subsequent transitional period from the defective region to the non-defective region where (1+alpha)(Soft Input) is again used. Once the subsequent transitional period has passed, the process could return to using the standard data input for processing. Based on the disclosure provided herein, one of ordinary skill in the art will recognize a variety of other modifications that may be implemented in accordance with yet other embodiments of the present invention. For example, in different embodiments of the present invention, the aforementioned transitional periods may not be accounted for, in which case the preceding pseudo-code can be simplified.

An output 483 of MAP detector 460 is provided to an adder circuit 484. Adder circuit 484 subtracts an instant 403 of extrinsic LLR output 433 that is aligned with output 483 (a delay circuit 401 assures the alignment) from output 483 to yield an output 487. Output 487 is provided to a multiplier circuit 481 that multiplies it by a scalar value 492 provided by a multiplexer 490. When media defect flag 455 is asserted such that a media defect is indicated, a programmable scalar value 482 is provided as scalar value 492. Otherwise, a default unity value 488 is provided as scalar value 492. $X_3, X_2, X_1$ and $X_0$ are inputs of a branch within MAP detector 460, and y is the output of the branch within MAP detector 460.

An output 465 of multiplier circuit 481 is provided to an LDPC decoder 470 that provides decoded output 475. LDPC decoder 470 provides LDPC decoding as is known in the art. Decoded output 475 may be iteratively processed by being fed back to MAP detector 460 until convergence is accomplished.

Figure 4A:
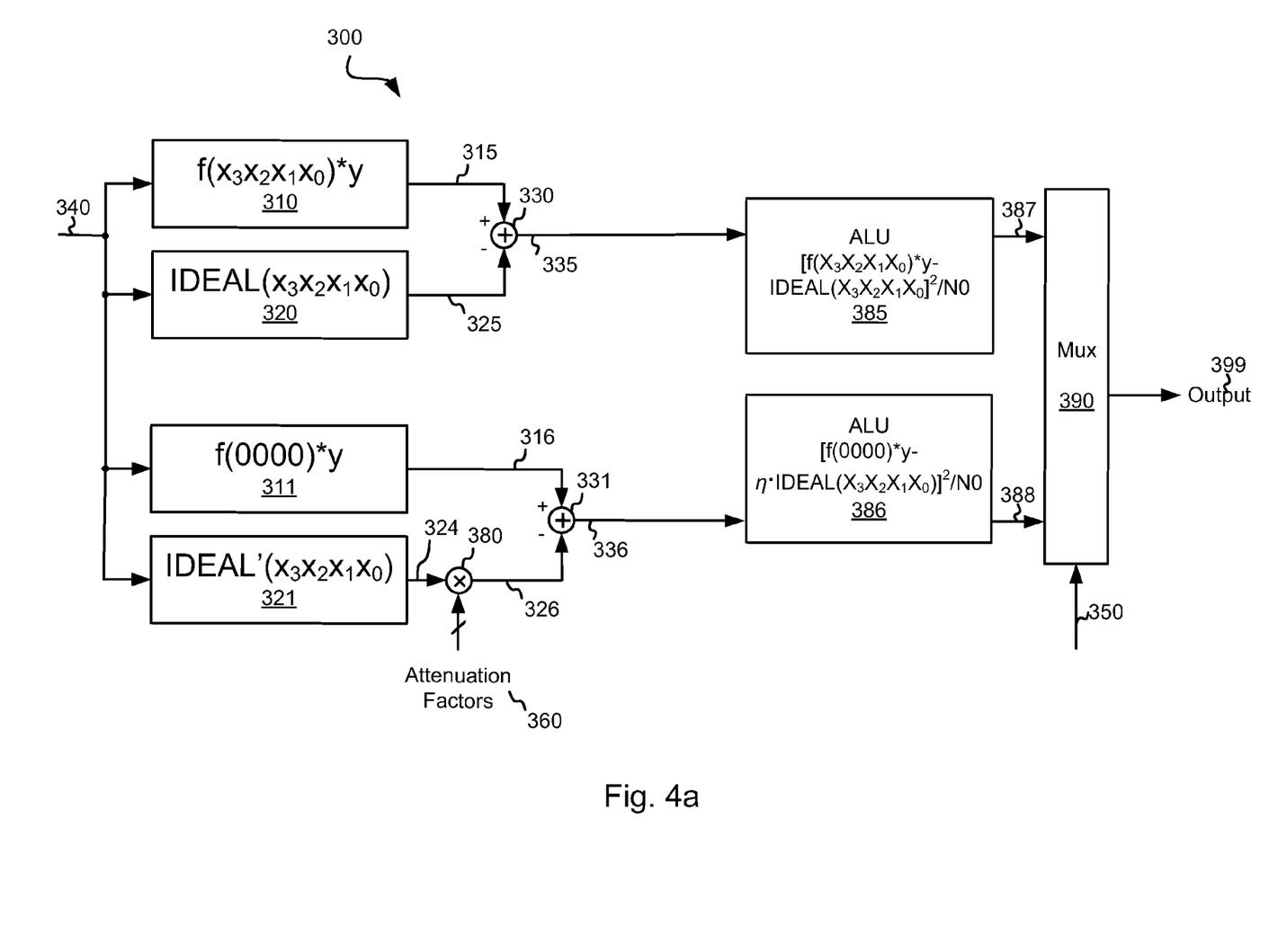
FIG. 4a depicts an attenuation correction circuit in accordance with one or more embodiments of the present invention.

Turning to FIG. 4a, an attenuation correction circuit 300 that may be used in accordance with different embodiments of the present invention is disclosed. Attenuation correction circuit 300 may be implemented as part of media defect detector and attenuation amplitude detector 440. Attenuation correction circuit 300 allows for selection of a non-adjusted signal when a media defect flag 350 does not indicate a defect region, and provides an adjusted signal when media defect flag 350 indicates a media defect region. Attenuation correction circuit 300 receives an input 340 (i.e., y) that is applied to four functional circuits 310, 320, 311, 321. In particular, input 340 is applied to a functional circuit 310 that includes a bank of sixteen noise predictive FIR (NPFIR) filters each designated by a combination of $(X_3X_2X_1X_0)$. Any noise predictive filter known in the art may be used. One example of a noise predictive filter is discussed in Kavcic et al., "A Signal-dependent Autoregressive Channel Model", IEEE Transactions on Magnetics, Vol. 35, September 1999, pp. 2316-2318. The entirety of the aforementioned reference is incorporated herein by reference for all purposes. Functional circuit 310 performs the noise prediction function f*y as is known in the art. Noise prediction FIR filters $f(X_3X_2X_1X_0)$ are optimized for defect free noise conditions at a particular channel density, media noise, signal to noise ratio, and the like. Input 340 is also applied to a functional circuit 320 that includes sixteen noise predictive FIR (NPFIR) filters each designated by a combination Of $(X_3X_2X_1X_0)$. Functional circuit 320 performs an IDEAL function that is defined by the following equation:

$$\text{IDEAL}(X_3X_2X_1X_0)=f(X_3X_2X_1X_0)*y_{x3x2x1x0}+\text{Bias}(X_3X_2X_1X_0),$$

where $y_{x3x2x1x0}$ is the noiseless output of the branch with input $X_3X_2X_1X_0$. Input 340 is also applied to a functional circuit 311 that includes a single noise predictive FIR (NPFIR) filter designated (0,0,0,0). Functional circuit 311 performs the function f*y as is known in the art. Input 340 is also applied to a functional circuit 321 that includes a single noise predictive FIR (NPFIR) filter designated (0,0,0,0). Functional circuit 321 performs the function IDEAL' that is defined by the following equation:

$$\text{IDEAL}'(X_3X_2X_1X_0)=f(0,0,0,0)*y_{x3x2x1x0}+\text{Bias}(0,0,0,0),$$

where Bias(0,0,0,0) indicates no bias.

An output 325 from functional circuit 320 is subtracted from an output 315 from functional circuit 310 using an adder circuit 330 that yields an aggregate value 335 defined by the following equation:

$$\text{Aggregate Value } 335=f(X_3X_2X_1X_0)*y-\text{IDEAL}(X_3X_2X_1X_0).$$

Aggregate value 335 is provided to an arithmetic logic unit 385. Arithmetic logic unit 385 performs the following function:

$$[f(X_3X_2X_1X_0)*y-\text{IDEAL}(X_3X_2X_1X_0)]^2/N0,$$

and provides an output 387 to a multiplexer circuit 390. An output 324 from functional circuit 321 is provided to a multiplier circuit 380 where it is multiplied by an attenuation factor 360 to yield a multiplied product 326. Multiplied product 326 is subtracted from an output 316 from functional circuit 311 using an adder circuit 331 that yields an aggregate value 336. Aggregate value 336 is provided to an arithmetic logic unit 386. Aggregate value 336 is defined by the following equation:

$$\text{Aggregate Value } 336=f(0000)*y-\eta\cdot\text{IDEAL}'(X_3X_2X_1X_0).$$

Arithmetic logic unit 386 performs the following function:

$$[f(0000)*y-\eta\cdot\text{IDEAL}'(X_3X_2X_1X_0)]^2/N0,$$

where $\eta$ is a selected one of attenuation factors 360. Again, the notation · indicates a multiplication function in contrast to * that indicates a convolution or filtering function. Arithmetic logic unit 386 provides an output 388 to multiplexer circuit 390. When media defect flag 350 is asserted indicating a defect region, multiplexer circuit 390 provides output 388 as output 399. Otherwise, multiplexer circuit 390 provides output 387 as output 399. The following pseudo-code represents an output 399 of attenuation correction circuit 300 based on media defect flag 350:

```
IF (Media Defect Flag 350 Indicates no Defect)
{
    Output 399 = [f(X₃X₂X₁X₀)*y-IDEAL(X₃X₂X₁X₀)]²/N0
}
ELSE IF (Media Defect Flag 350 Indicates a Defect)
{
    Output 399 = [f(0000)*y-η·IDEAL'(X₃X₂X₁X₀)]²/N0
}
```

Again, the notation · indicates a multiplication function in contrast to * that indicates a convolution or filtering function.

Figure 4B:
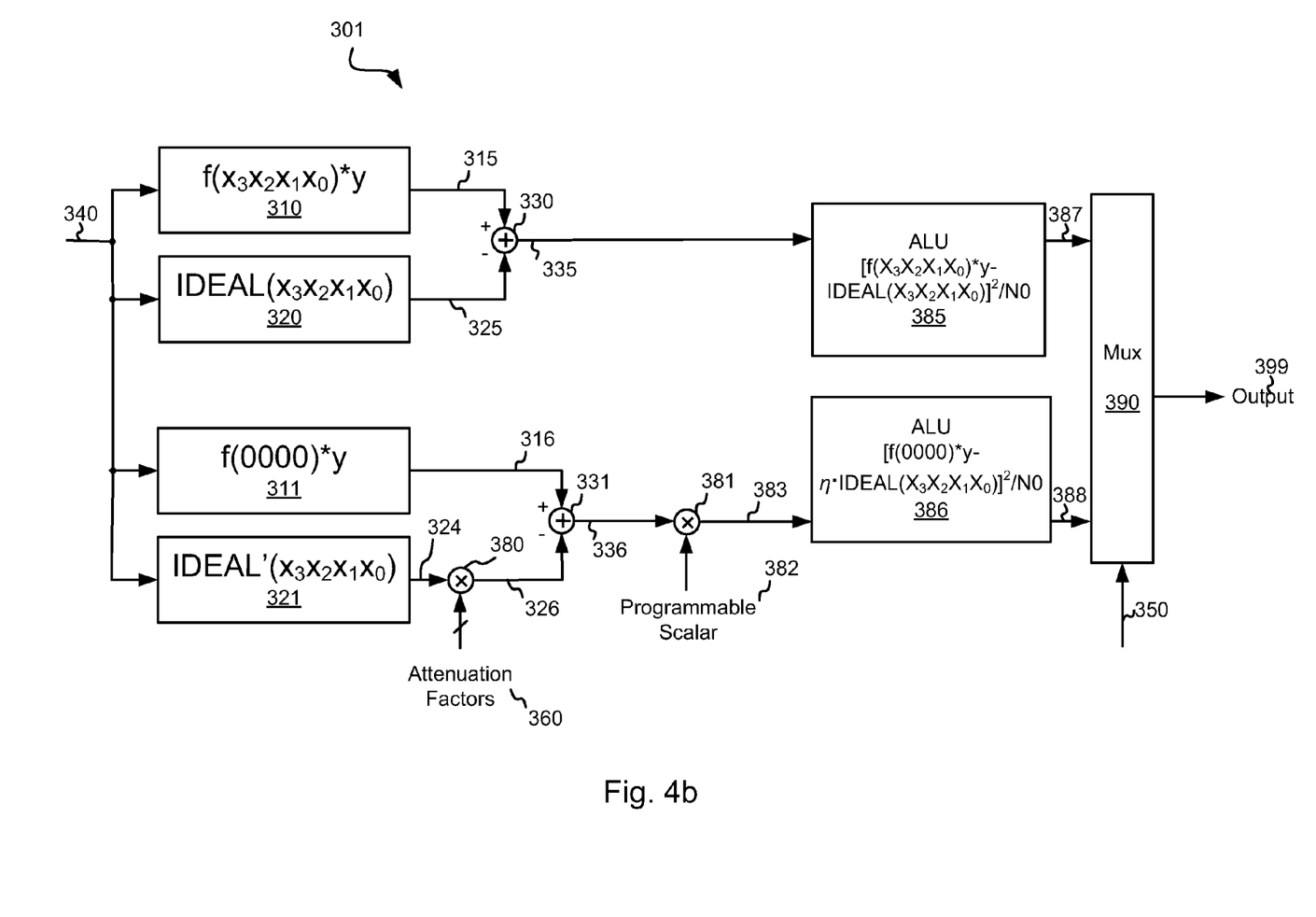
FIG. 4b depicts another attenuation correction circuit in accordance with one or more embodiments of the present invention.

Turning to FIG. 4b, an attenuation correction circuit 301 that may be used in accordance with some embodiments of the present invention is disclosed. Attenuation correction circuit 301 is similar to attenuation circuit 300, except that it includes a multiplier circuit 381 that multiplies aggregate value 336 by a programmable scalar 382. Multiplier circuit 381 yields a multiplied product 383 to arithmetic logic unit 386. Multiplied product 383 is defined by the following equation:

$$\text{Multiplied Product } 383=(\text{Programmable Scalar } 382)[f(0000)*y-\eta\cdot\text{IDEAL}'(X_3X_2X_1X_0)].$$

Again, the notation · indicates a multiplication function in contrast to * that indicates a convolution or filtering function. Accordingly, the pseudo-code representing output 399 is modified as follows:

```
IF (Media Defect Flag 350 Indicates no Defect)
{
    Output 399 = [f(X₃X₂X₁X₀)*y-IDEAL(X₃X₂X₁X₀)]²/N0
}
ELSE IF (Media Defect Flag 350 Indicates a Defect)
{
    Output 399 = [(Programmable Scalar 382)(f(0000)*y-
       η·IDEAL'(X₃X₂X₁X₀))]²/N0
}
```

Figure 5:
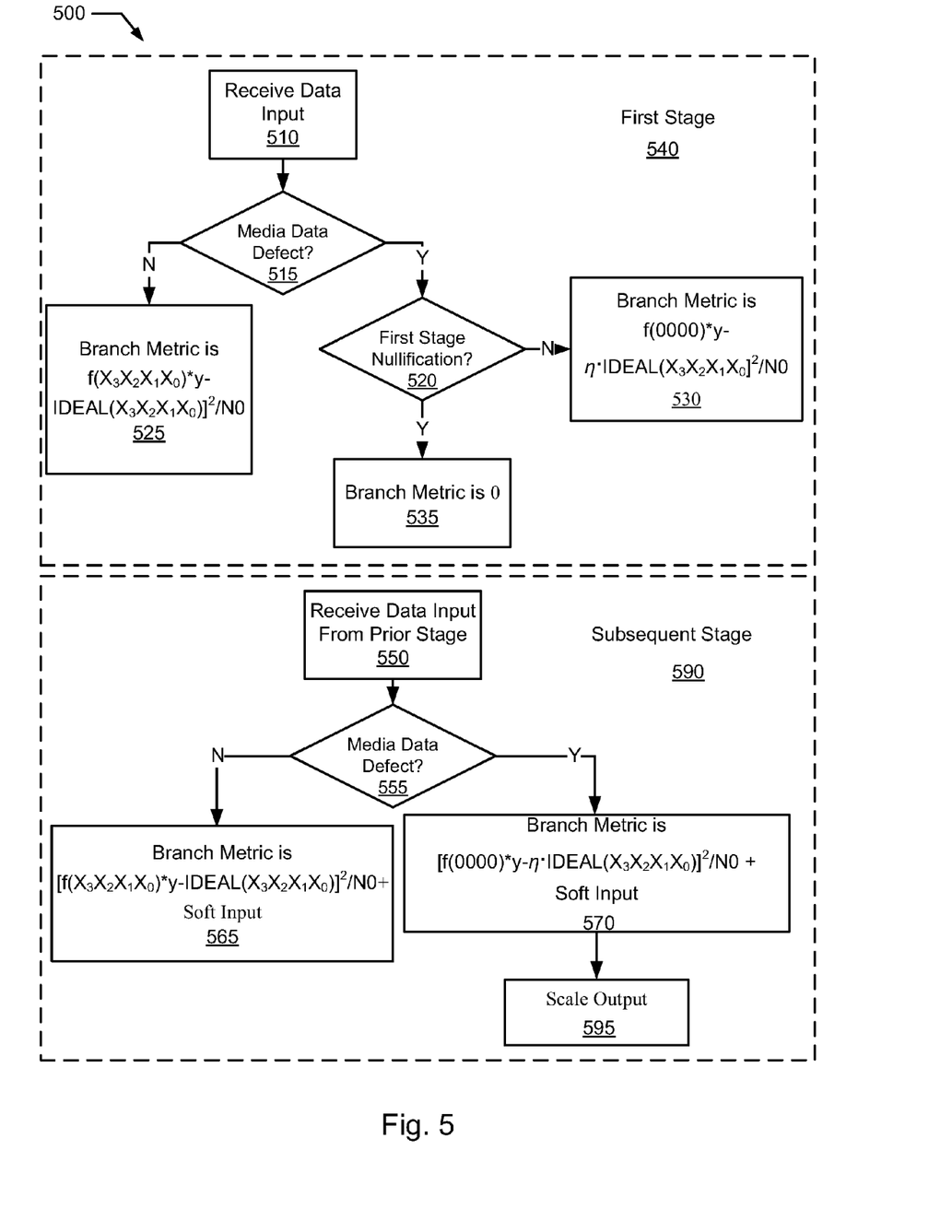
FIG. 5 is a flow diagram depicting a method for data regeneration in accordance with various embodiments of the present invention.

Turning to FIG. 5, a flow diagram 500 depicts a method in accordance with various embodiments of the present invention for data regeneration. Flow diagram 500 is described in relation to a first stage 540 and a second stage 590. In first stage 540, a data input is received (block 510). This data input may be received, for example, from a magnetic storage medium. Based on the disclosure provided herein, one of ordinary skill in the art will recognize a variety of media from which the data input may be received. It is determined whether a media defect has been detected in relation to the particular data input (block 515). Where a media defect is not indicated (block 515), a branch metric related to processing the data input is selected to be $[f(X_3X_2X_1X_0)*y-\text{IDEAL}(X_3X_2X_1X_0)]^2/N0$ (block 525). Alternatively, where it is determined that a media defect is indicated (block 515), it is determined whether first stage nullification is desired (block 520). Where first stage nullification is desired (block 520), the branch metric is set equal to zero (block 535). In contrast, where it is determined that first stage nullification is not desired (block 520), the branch metric is selected to be $[f(0000)*y-\eta\cdot\text{IDEAL}'(X_3X_2X_1X_0)]^2/N0$ (block 530). Again, the notation · indicates a multiplication function in contrast to * that indicates a convolution or filtering function.

In subsequent stage 590, soft data from a prior stage is received after processing through a decoder (block 550). It is determined if the data was associated with a media defect (block 555). Where it was associated with a media defect (block 555), the branch metric is selected to be $[f(0000)*y-\eta\cdot\text{IDEAL}'(X_3X_2X_1X_0)]^2/N0+\text{Soft Input}$ (block 570) and the output is scaled by a programmable scaling factor (block 595). In contrast, when a media defect is not indicated (block 555), the branch metric is selected to be $[f(X_3X_2X_1X_0)*y-\text{IDEAL}(X_3X_2X_1X_0)]^2/N0+\text{Soft Input}$ (block 565).

It should be noted that various modifications to the specific embodiments of the present invention discussed herein may be done in accordance with the breadth of the inventions disclosed herein. For example, it may be that the transitional period between a defective and non-defective region may be considered too volatile to use for regenerating a data signal in accordance with the approaches discussed herein. In such cases, it may be that data regeneration is only performed in the middle of the window during which a media defect flag is asserted. This would avoid data regeneration during the transition from a non-defective region to a defective region, and from a defective region to a non-defective region. In such a case, a simple erasure process (i.e., setting the data equal to a known value such as zero) may be applied once a media defect is identified and for a period after the media defect is identified. Once the period has passed, the process may convert to utilizing regenerated data. This process of using regenerated data could then be replaced by another period of the simple erasure process when the end of the defect period is predicted. Once the media defect has passed, the process could return to using the standard data input for processing. Based on the disclosure provided herein, one of ordinary skill in the art will recognize a variety of other modifications that may be implemented in accordance with yet other embodiments of the present invention.

Figure 6:
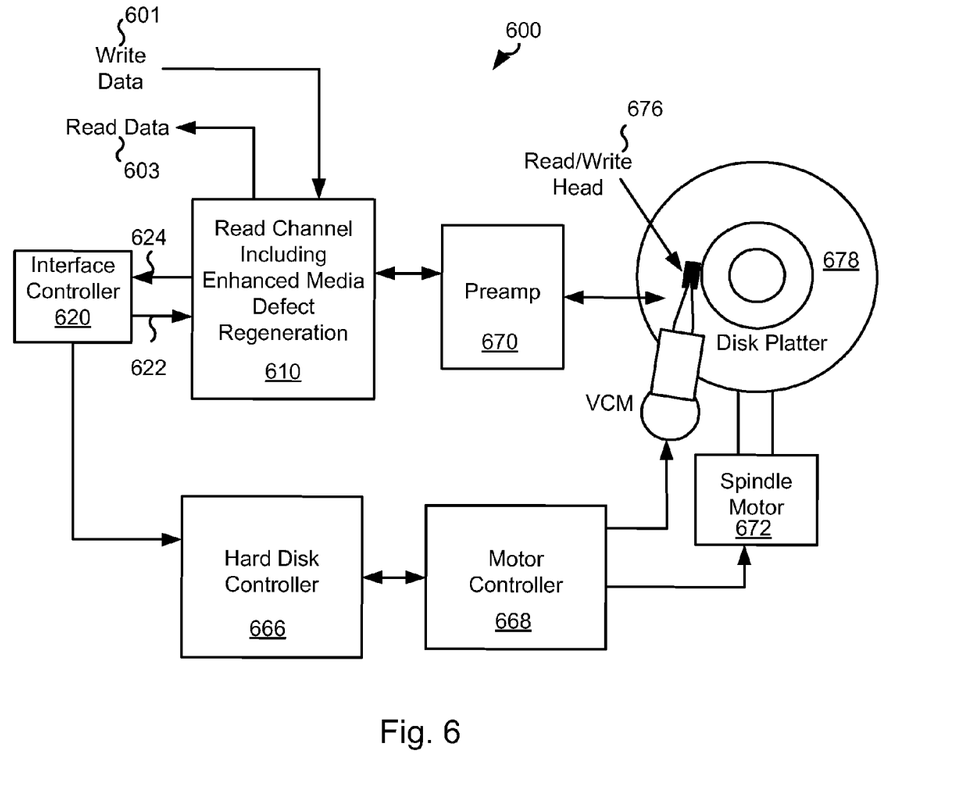
FIG. 6 is a storage system including an enhanced media defect regeneration system in accordance with one or more embodiments of the present invention.

Turning to FIG. 6, a storage system 600 including a read channel circuit 610 with an enhanced media defect regeneration system is shown in accordance with various embodiments of the present invention. Storage system 600 may be, for example, a hard disk drive. Storage system 600 includes a read channel 610 with an enhanced media defect regeneration system in accordance with different embodiments of the present invention. The incorporated enhanced media defect regeneration system may be similar to that discussed above in relation to FIGS. 2-4, and/or may operate in accordance with the method described above in relation to FIG. 5.

In addition to read channel circuit 610, storage system 600 includes an interface controller 620, a preamp 670, a hard disk controller 666, a motor controller 668, a spindle motor 672, a disk platter 678, and a read/write head 676. Interface controller 620 controls addressing and timing of data to/from disk platter 678. The data on disk platter 678 consists of groups of magnetic signals that may be detected by read/write head assembly 676 when the assembly is properly positioned over disk platter 678. In a typical read operation, read/write head assembly 676 is accurately positioned by motor controller 668 over a desired data track on disk platter 678. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs).

Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel module 664 via preamp 670. Preamp 670 is operable to amplify the minute analog signals accessed from disk platter 678. In addition, preamp 670 is operable to amplify data from read channel module 610 that is destined to be written to disk platter 678. In turn, read channel module 610 decodes (including media defect detection) and digitizes the received analog signal to recreate the information originally written to disk platter 678. This data is provided as read data 603 to a receiving circuit. A write operation is substantially the opposite of the preceding read operation with write data 601 being provided to read channel module 610. This data is then encoded and written to disk platter 678.

In conclusion, the invention provides novel systems, devices, methods and arrangements for regenerating data derived from a defective medium. While detailed descriptions of one or more embodiments of the invention have been given above, various alternatives, modifications, and equivalents will be apparent to those skilled in the art without varying from the spirit of the invention. For example, one or more embodiments of the present invention may be applied to iterative decoding channels that either include or do not include a LDPC coded channel. Alternatively, the techniques discussed herein may be applied to either a non-precoded channel or to a precoded channel. Further, techniques discussed herein may be applied to analog to digital converters as well. Therefore, the above description should not be taken as limiting the scope of the invention, which is defined by the appended claims.

What is claimed is:

1. A method for regenerating data derived from a defective medium, the method comprising:
providing a data regeneration circuit, wherein the data regeneration circuit includes a first data path including a bank of two or more selectable noise prediction filters and a second data path including a fixed noise prediction filter;
receiving a data input, wherein the data input is derived from a medium;
identifying a media defect corresponding to the data input;
based at least in part on the identified media defect, asserting a media defect flag;
selecting the second data path for processing whenever the media defect flag is asserted;
determining an attenuation factor associated with the defective medium, wherein the attenuation factor is incorporated in the second data path; and
augmenting the data input by a derivative of the attenuation factor to regenerate the data.

2. The method of claim 1, wherein at least one output from the second data path is non-zero.

3. The method of claim 2, wherein the data input is represented as y, the attenuation factor is represented as $\eta$, the fixed noise prediction filter is represented as $f(0000)$, and an ideal filter is represented as $IDEAL'(X_3X_2X_1X_0)$, wherein the second data path yields an output represented as: $[f(0000)*y - \eta \cdot IDEAL'(X_3X_2X_1X_0)]^2/N0$.

4. The method of claim 2, wherein the data input is a first data input, wherein the method further comprises:
receiving a second data input, wherein the second data input is derived from the medium;
determining that the medium is non-defective at the location corresponding to the second data input; and
selecting the first data path for processing whenever the media defect flag is de-asserted.

5. The method of claim 1, wherein the second data path includes a multiplier augmenting the processed data by a programmable scalar value.

6. The method of claim 1, wherein an output of the second data path is multiplied by a programmable scalar value.

7. A system for regenerating data, the system comprising:
a media defect detector, wherein the media defect detector is operable to identify a potential media defect associated with a medium from which an input signal is derived;
an attenuation amplitude detector, wherein the attenuation amplitude detector generates an attenuation factor associated with the potential media defect;
a data detector, wherein the data detector includes a first data path and a second data path, wherein the first data path includes a bank of two or more selectable noise prediction filters and the second data path includes a fixed noise prediction filter and the attenuation factor, and wherein the data detector processes a derivative of the input signal using the second data path when the potential media defect is indicated by augmenting the data input by a derivative of the attenuation factor to regenerate data.

8. The system of claim 7, wherein the data detector is a maximum a posteriori detector.

9. The system of claim 7, wherein the data detector is a soft output Viterbi algorithm detector.

10. The system of claim 7, wherein an output of the data detector is provided to a decoder, and wherein the decoder provides a decoded output reflecting a regenerated value of the input signal.

11. The system of claim 10, wherein the decoder is a low density parity check decoder.

12. The system of claim 7, wherein the data input is represented as y, the attenuation factor is represented as $\eta$, the fixed noise prediction filter is represented as $f(0000)$, and an ideal filter is represented as $IDEAL'(X_3X_2X_1X_0)$, wherein the second data path yields an output represented as: $[f(0000)*y-\eta \cdot IDEAL'(X_3X_2X_1X_0)]^2/N0$.

13. The system of claim 7, wherein the data detector processes a derivative of the input signal processed by the first data path when a media defect is not indicated.

14. The system of claim 7, wherein the data detector processes the input signal without augmentation by the attenuation factor when the potential media defect is not indicated.

15. The system of claim 7, wherein the system further includes a decoder circuit, and wherein an output of the data detector is provided to the decoder circuit.

16. The system of claim 15, wherein the decoder circuit is an LDPC decoder circuit.

17. The system of claim 7, wherein an output of the second data path is multiplied by a programmable scalar value.

18. The system of claim 7, wherein the second data path includes a multiplier augmenting the processed data by a programmable scalar value.

19. A system for regenerating data, the system comprising:
a media defect detector, wherein the media defect detector is operable to identify a potential media defect associated with a medium from which an input signal is derived;
an attenuation amplitude detector, wherein the attenuation amplitude detector generates an attenuation factor;
a data detector, wherein the data detector includes a first data path and a second data path, wherein the first data path includes a bank of two or more selectable noise prediction filters and a second data path includes a fixed noise prediction filter and the attenuation factor, and wherein the data detector processes a derivative of the input signal processed by the second data path when the potential media defect is indicated;
wherein an output of the second data path is multiplied by a first programmable scalar value; and
wherein the first data path includes a multiplier augmenting the processed data by a second programmable scalar value.

20. The system of claim 19, wherein the data detector is a maximum a posteriori detector.

21. The system of claim 19, wherein the data detector is a soft output Viterbi algorithm detector.

22. The system of claim 19, wherein an output of the data detector is provided to a decoder, and wherein the decoder provides a decoded output reflecting a regenerated value of the input signal.

23. The system of claim 22, wherein the decoder is a low density parity check decoder.

24. The system of claim 19, wherein the data input is represented as y, the attenuation factor is represented as $\eta$, the fixed noise prediction filter is represented as $f(0000)$, and an ideal filter is represented as $IDEAL'(X_3X_2X_1X_0)$, wherein the second data path yields an output represented as: $[f(0000)*y-\eta \cdot IDEAL'(X_3X_2X_1X_0)]^2/N0$.

25. The system of claim 19, wherein the data detector processes a derivative of the input signal processed by the first data path when a media defect is not indicated.

26. The system of claim 19, wherein the data detector processes the input signal without augmentation by the attenuation factor when the potential media defect is not indicated.

27. The system of claim 19, wherein the system further includes a decoder circuit, and wherein an output of the data detector is provided to the decoder circuit.

28. The system of claim 27, wherein the decoder circuit is an LDPC decoder circuit.

29. The system of claim 19, wherein the system is implemented as part of a data storage device.

30. The system of claim 19, wherein the system is implemented as part of an integrated circuit.

31. The system of claim 7, wherein the system is implemented as part of a data storage device.

32. The system of claim 7, wherein the system is implemented as part of an integrated circuit.

33. A data processing circuit, the data processing circuit comprising:
a media defect detector operable to identify a potential defect on a medium from which an input signal is derived, and to assert a defect flag;
an attenuation amplitude detector operable to calculate an attenuation of the input signal and to provide an attenuation factor corresponding to the attenuation of the input signal; and
a data processor circuit operable to receive a processing input, wherein the processing input is derived from the input signal multiplied by the attenuation factor during a period when the defect flag is asserted;
wherein the input signal is represented as y, the attenuation factor is represented as $\eta$, the fixed noise prediction filter is represented as $f(0000)$, and an ideal filter is represented as $IDEAL'(X_3X_2X_1X_0)$, wherein the second data path yields an output represented as: $[f(0000)*y-\eta \cdot IDEAL'(X_3X_2X_1X_0)]^2/N0$.

34. The circuit of claim 33, wherein the data processor circuit is a data detector circuit.

35. The circuit of claim 34, wherein the data detector circuit is selected from a group consisting of: a maximum a posteriori detector circuit, and a Viterbi algorithm detector circuit.

36. The circuit of claim 33, wherein the circuit is implemented as part of a data storage device.

37. The circuit of claim 33, wherein the circuit is implemented as part of an integrated circuit.

38. The circuit of claim 33, wherein at least one instance ops the attenuation factor is non-zero.

39. The circuit of claim 33, wherein the period is a first period, and wherein the processing input is the input signal during a second period when the defect flag is de-asserted.

40. The circuit of claim 7, wherein at least one output from the second data path is non-zero.

* * * * *